United States Patent [19]

Ringleb et al.

[11] Patent Number: 4,894,605
[45] Date of Patent: Jan. 16, 1990

[54] METHOD AND ON-CHIP APPARATUS FOR CONTINUITY TESTING

[75] Inventors: Diethelm Ringleb, Andover; Reinhard Schumann, Stow; Elsworth Stearns, Hudson; Tom Stylianos, Jr., Acton, all of Mass.; John Sweeney, Derry, N.H.

[73] Assignee: Digital Equipment Corporation, Maynard, Mass.

[21] Appl. No.: 159,757

[22] Filed: Feb. 24, 1988

[51] Int. Cl.$^4$ ............... G01R 27/02; G01R 31/28
[52] U.S. Cl. ............... 324/537; 324/158 R
[58] Field of Search ............... 324/73 R, 158 R, 500, 324/555, 537; 371/20, 25; 437/8

[56] References Cited

U.S. PATENT DOCUMENTS

| | | | |
|---|---|---|---|
| 3,249,926 | 5/1966 | Ashley | 365/201 |
| 4,301,403 | 11/1981 | Hawkes et al. | 324/62 |
| 4,479,088 | 10/1984 | Stopper | 324/73 R X |
| 4,509,008 | 4/1985 | Dasgupta et al. | 324/73 R X |
| 4,586,242 | 5/1986 | Harrison | 437/8 X |
| 4,638,246 | 1/1987 | Blank et al. | 324/73 R X |
| 4,707,654 | 11/1987 | Suzuki et al. | 324/73 R X |
| 4,779,041 | 10/1988 | Williamson, Jr. | 324/73 R X |

OTHER PUBLICATIONS

Blake et al; "Test Site Technology in Integrated Circuits"; IBM Technical Disclosure Bulletin; vol. 10, No. 2; Jul. 1967; pp. 168–169.

Primary Examiner—Reinhard J. Eisenzopf
Assistant Examiner—Vinh P. Nguyen
Attorney, Agent, or Firm—Nutter, McClennen & Fish

[57] ABSTRACT

A method of performing continuity testing of individual lead sets bonded to an integrated semiconductor component with a continuity test circuit fabricated on the component. The continuity test circuit includes a plurality of current gates, each of which is associated with a different semiconductor component contact pad a lead set is bonded to. Each current gate includes a first terminal connected to the associated contact pad and a second terminal connected to a common conductor all the current gate second terminals are connected to. The common conductor terminates at a semiconductor component contact test pad a lead set is bonded to. Whenever a test signal is applied to either the first or second terminal of a current gate, a measurable response signal is generated by the current gate over the other terminal. Continuity testing of the lead sets bonded to the chip is performed by applying a test signal to either a wiring board conductor connected to the lead set being tested or a wiring board conductor connected to the lead set connected to the semicondcutor component test contact pad. A test probe is then applied to the board conductor the test signal is not applied to. If the response signal is sensed, the leads are properly bonded; if no response signal is detected either the lead set being tested on the lead set connected to the semiconductor component is improperly bonded. The current gate blocks signals on the first terminal from appearing on the second terminal or the common conductor. Thus, when the semiconductor component is in use, the continuity test circuit is isolated from the other individual circuit components forming the integrated semiconductor component.

12 Claims, 5 Drawing Sheets

METHOD AND ON-CHIP APPARATUS FOR CONTINUITY TESTING

FIELD OF THE INVENTION

This invention relates generally to the field of semiconductor chips, and in particular to an on-chip circuit that readily allows continuity testing of all electrical connections to a chip.

BACKGROUND OF THE INVENTION

Integrated semiconducting components, known as chips, are employed in practically every modern electronic device. Each chip comprises a large number of individual components that have been fabricated together on a small piece of semiconducting material to form a single circuit. The use of chips has made it possible to manufacture modern electronic devices that outperform, and are significantly more compact than, their predecessors.

A typical chip has a number of contact pads which are locations on the surface of the chip at which voltages are supplied and/or drawn from. Conductive leads provide electrical paths between each contact pad and conductors on a printed wiring board on which the chip is mounted. Frequently, two leads are required for each contact point-to-wiring board conductor connection. A first lead, an inner lead, typically a very thin wire, is bonded to the chip contact pad. The inner lead is then bonded to a second lead, an outer lead, which is a reinforced metal lead or pin that, in turn, can be suitably bonded or attached to a terminal connected to the wiring board conductor. Leads are usually bonded to a chip as part of the post-fabrication packaging process wherein the chip is housed in a protective carrier. After packaging, the chip and inner leads are contained entirely in the carrier, and portions of the outer leads extend outward therefrom for bonding to the wiring board conductor terminals. Since two leads are required for each chip contact pad-to-wiring board conductor terminal connection, three separate bonds are required for each connection, namely, the chip contact pad to inner lead bond; the inner lead to outer lead bond; and the outer lead to conductor terminal bond.

Performing the bonding needed for chip-to-wiring board connections is a delicate process. This is in part because each bond, especially the contact pad to inner lead bond, is between two very small pieces, and must be performed without affecting other bonds located in very close proximity thereto. Moreover, housing the chip in the carrier may cause one or more of the leads bonded thereto to break or otherwise become disconnected. Also, there are additional elements of error in the inner lead-to-outer lead and outer lead-to-wiring board conductor terminal bonding processes. Thus, there is always the possibility that either during the chip lead bonding process, or during the processes of mounting the packaged component to wiring board mounting, one or more of the chip leads will be improperly bonded and a necessary chip-to-wiring board conductor connection won't be made.

Recent advances in electronic component manufacturing and assembly techniques have led to the development of automated equipment that performs the necessary lead bonding with a high degree of accuracy. However, automated equipment is not fail safe, and instances of faulty lead bonding still occur.

Therefore, an important part of the electronic device assembly processes is continuity testing. Continuity testing is performed to verify that the necessary lead bonding has been properly performed for each chip contact pad, and that a continuous electrical path exists between each chip contact pad and the wiring board conductor terminal it should be connected to. Continuity testing may also be performed after chip packaging to verify that the contact pad-to-lead bonds were properly formed. Continuity testing after chip mounting is one of the final inspections of an assembled electronic circuit performed in order to verify that the chips forming the circuit will operate properly.

Currently, continuity testing is performed by supplying a chip with test voltages and monitoring the result. This allows personnel operating the test equipment to verify the leads over which the test signals are supplied to the chip are properly bonded, and that leads over which the response signals from the chip are properly bonded. There are two ways to perform this type of continuity testing, namely, open testing and test pattern testing.

Open testing involves applying a test voltage to a single printed wiring board conductor connected to a chip and monitoring a second board conductor to detect an output signal. If no signal is detected, then one of the bonds, either the leads over which voltage is supplied to the chip or the leads over which voltage is propagated therefrom, is improperly bonded.

Unfortunately, open testing is not suitable for continuity testing chips which comprise most modern electronic devices. This is because there is usually more than one conductive path between the board conductor at which the test voltage is applied, and the board conductor at which the output signal is sensed. Thus, the output signal may be correctly detected even if one or more of the leads in the circuit is improperly bonded.

Continuity testing by applying a test pattern is an advanced form of open testing. In test pattern testing, a set of voltages comprising a test pattern is applied to the chip over a number of different board conductors connected thereto. A set of sensors connected to the board conductors extending from the chip monitor voltages comprising a response pattern which is produced by the chip in response to the test pattern.

There are limitations associated with test pattern continuity testing. Supplying test patterns is a time consuming process because a number of different test patterns may have to be supplied in order to generate at least one signal over each output lead. Moreover, the design of some chips may make it impossible to generate test patterns so that each signal is supplied to or read from each lead bonded to a chip. Also specific knowledge of the chip being tested must be known in order to perform test pattern testing which verifies that the response pattern is correctly generated.

Additional disadvantages are associated with test pattern continuity testing of Large Scale Integration (LSI) and Very Large Scale Integration (VLSI) chips. LSI chips and VLSI chips are the product of recent advances in semiconductor chip manufacturing. Each LSI and VLSI chip comprises thousands of individual components that have been fabricated together on a single section of semiconducting material. LSI and VLSI chips are able to perform more functions, and perform functions faster than earlier chips. The development of LSI and VLSI chips, and in the future Gigascale Integration (GSI) chips which comprise millions of components each, has and will continue to make further advances in electronics possible.

Test pattern continuity testing of LSI, VLSI and GSI chips is unsuitable for a number of reasons. Each of these chips may be connected to a hundred or more leads that are required for all the input and output electrical connections the chip needs to operate. Consequently, performing a continuity test by supplying test patterns would take a significant amount of time in order to apply all the test patterns to the input leads in order to get the desired results from all the output leads. Moreover, providing and operating equipment that can generate the necessary test patterns can be costly. Also, many of these chips include what are referred to as "dynamic" components, that require producing a large number of test patterns during a short period of time in order to generate a large number of response patterns, also produced during a short period of time. Providing and operating testing devices that can rapidly generate the required test patterns, and that monitor the rapidly changing response patterns, is costly.

SUMMARY OF THE INVENTION

The invention provides a new and improved method and apparatus for testing the continuity of all the leads bonded to a chip with a minimal amount of effort and test equipment.

In brief summary, the new continuity test apparatus includes an on-chip test circuit that is fabricated as part of the chip. The test circuit includes a set of current gates, each of which is connected to a separate chip contact pad. Each current gate includes a first terminal connected to the chip contact pad and a second terminal connected to a common on-chip conductor all the component second terminals are connected to. The common conductor terminates at a test contact pad on the chip. Depending upon the construction of a particular on-chip continuity test circuit, when a test signal is applied to either the first terminal or second terminal of the current gate, a response signal is generated by the current gate over the other terminal.

Continuity testing is performed with the on-chip continuity test circuit by initially applying a test voltage to the appropriate wiring board conductor, the conductor associated with the lead set being tested or the conductor associated with the on-chip common conductor. A test probe is applied to the complementary wiring board conductor, i.e., the wiring board conductor the test signal is not applied to, to monitor if a response signal is detected. In some embodiments of the on-chip continuity test circuit, it may be necessary to simultaneously apply a voltage to the lead set that the test probe is applied to.

If all the leads comprising an individual lead set are properly bonded, a measurable response signal will be detected on the complementary wiring board conductor, either the conductor connected to the on-chip common conductor or the conductor connected to the lead set being tested. However, if the individual leads forming the lead set are not properly bonded, either the test signal will not be applied to the current gate, or the response signal will not be properly transmitted therefrom. In either situation, there will be no response signal which serves as an indication of failed lead bonding.

When the proper signals and voltages for continuity testing are not applied, the current gates prevent signal propogation between the first and second terminals regardless of the currents that may be applied to the chip contact pads. Thus, except during testing, the continuity test circuit is isolated from the other components on the chip.

The on-chip continuity test circuit allows for the ready testing of all the lead bondings without the need of supplying a large number of test vectors to the chip. The continuity of each set of leads bonded to a chip can be readily tested with this test circuit. To rapidly test all the leads that may be bonded to LSI, VLSI or GSI chip, an inexpensive test apparatus can be built that sequentially applies a voltage to each lead set to be tested and detects whether an appropriate resultant current is produced. Only low voltages are applied to perform continuity testing with the on chip test circuit. Moreover, a voltage only has to be applied once to a lead set and contact pad to test the continuity of the lead bonds associated therewith. Thus, the possibility of the continuity testing subjecting the components on the chip to excessive voltages that would cause them to burn out is essentially eliminated.

BRIEF DESCRIPTION OF THE DRAWINGS

This invention is pointed out with particularity in the appended claims. The above and further advantages of this invention may be better understood by referring to the following description taken in conjunction with the accompanying drawings in which:

DETAILED DESCRIPTION OF THE ILLUSTRATED EMBODIMENTS

Figure 1:
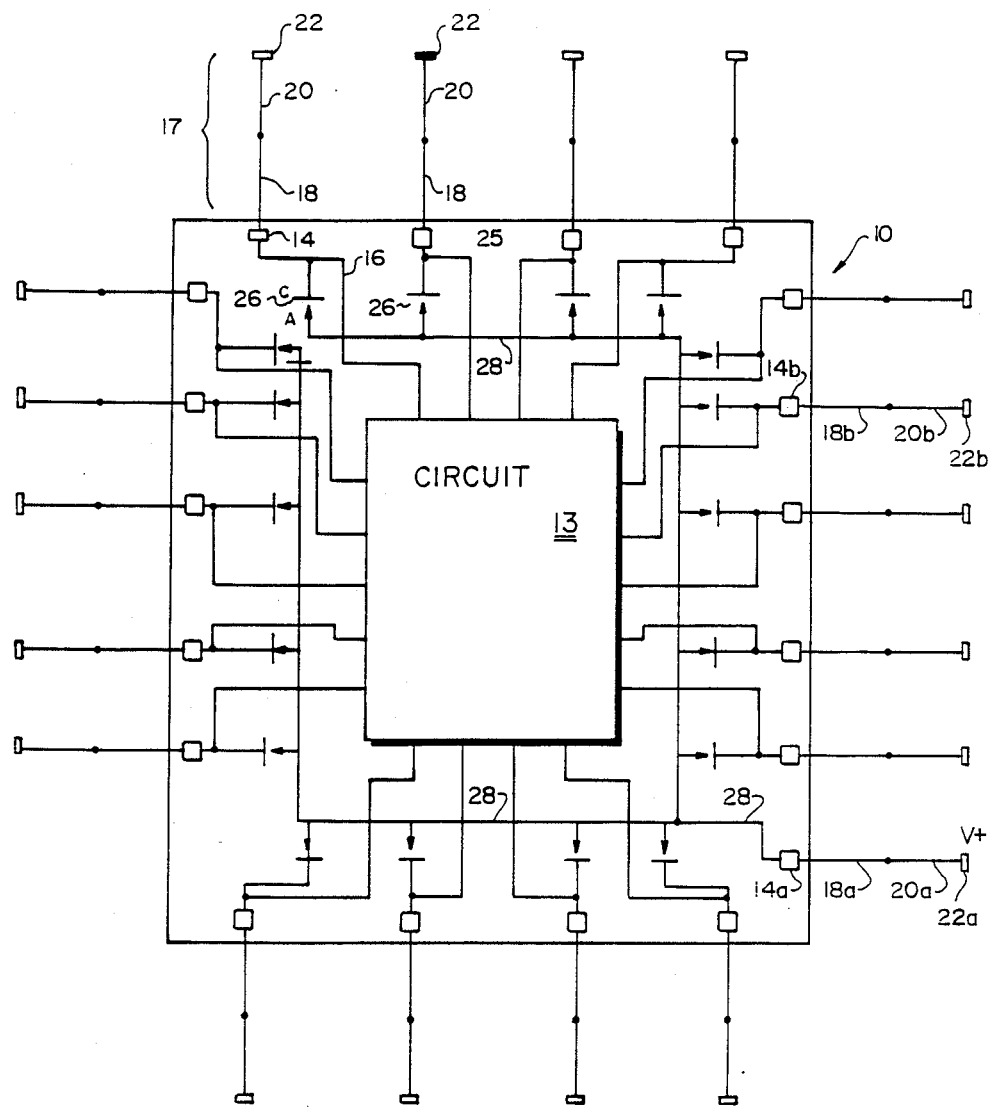
FIG. 1 is a circuit diagram of an embodiment of the on-chip continuity test circuit constructed in accordance with the invention particularly directed to a chip containing bipolar components.

FIG. 1 depicts a semiconductor component comprising a chip 10 that includes a circuit 12 comprising a number of bipolar semiconducting components fabricated and connected together in order to perform a specific function. The chip 10 includes a number of contact pads, generally identified by reference number 14, which are the points at which input voltages are applied to the chip 10 and output voltages are sensed therefrom. On-chip conductors 16 provide the necessary electrical paths between the circuit 12 components and the contact pads 14.

Connected to each contact pad 14 is a lead set 17 comprising one or more leads, generally identified by reference numbers 18 and 20, that provide the necessary external conductive paths between the contact pads 14 and the off-chip circuit elements they are connected to.

Usually, an off-chip circuit element is a conductor terminal, generally identified by reference number 22, on the printed wiring board on which the chip 10 is mounted. Typically, lead 18, an inner lead, is a piece of thin wire bonded at one end to the contact pad. Lead 20, an outer lead, is formed of reinforced metal, bonded at one end to lead 18 and at the other end to a conductor terminal 22 on the printed wiring board. Usually the chip 10 is housed in a protective carrier (not illustrated) so that the leads 20 are disposed partially in and partially out of the carrier. Although two leads 18 and 20 are commonly used to form the necessary contact pad 14-to conductor terminal 22 connection, lead assemblies using single leads, or more than two leads, to provide conductive paths are sometimes used.

The chip 10 is provided with an on-chip continuity test circuit 25 to verify that the leads 18 and 20 have been properly bonded to each other, the contact pad 14 and the conductor terminal 22. For the chip 10 with a circuit 12 comprising bipolar components, the test circuit 25 incudes a number of diodes 26, each of which has a cathode terminal connected to a contact pad conductor 16. Each diode 26 has an anode terminal, all of which are connected to a common on-chip conductor 28 that is distinct from the substrate forming the chip. The common conductor 28 terminates at one on-chip test contact pad identified by reference numeral 14a. Leads 18a and 20a provide a conductive path between the test contact pad 14a and the test conductor terminal 22a on the printed wiring board.

The electrical continuity of the bonds used to secure leads 18 and 20 to each other, the leads 18 to the appropriate chip contact pads 14, and the leads 20 to the appropriate conductor terminals 22, are tested by applying a small positive voltage, V+, to the test conductor terminal 22a and measuring the current between that point and the conductor terminal the leads 18b and 20b being tested are connected to. The application of the test voltage should normally cause a measurable current to flow in a sub-circuit formed by the application of the voltage that includes leads 18a and 20a and leads 18b and 20b.

The diode 26 in the tested sub-circuit will allow current to flow from the test contact terminal 22a to the contact terminal 22b tied to ground. In other words, the diode 26 functions as a current gate, allowing the forward-biased voltage operating as a test signal from its anode terminal to its cathode terminal as a response signal. If all the leads 18a, 18b, 20a and 20b are properly bonded, there will be a measurable current flow. If any of the leads 18 or 20 are unconnected, for example the lead 18b is not bonded to the proper contact pad 14b, or the leads 18a and 20a are not properly bonded together, the circuit will be open and zero current will be detected at the measuring point.

When the chip 10 is in use, the diodes 26 prevent current flow from the contact pad conductors 16 to the common conductor 28. Thus, positive voltages on the contact pad conductors 16, as part of either input signals to the circuit 12 or output signals therefrom, will not appear across the diodes 26 and common conductor where they could subsequently be erroneously interpreted as either input or output signals on other contact pad conductors 16 connected to the circuit 12. Moreover, when the chip 10 is in use, the test contact terminal 22a is tied to a ground voltage.

The on-chip continuity test circuit 25 allows the testing of the bonding of all of the leads 18 and 20 connected to the chip 10. The only instrument needed to perform the continuity test is a low-current range ammeter with and a low voltage source. It is possible to provide a test apparatus with multiple contacts to all the conductor terminals 22 so voltages can be concurrently applied to all the leads associated with current measuring. This would make it possible to perform a continuity test on all the leads 18 and 20 in a minimal amount of time. Moreover, since the diodes 26 block contact pad conductor 16-to-common conductor 28 current flow, the test circuit 25 is effectively isolated from the components forming the chip circuit 12.

Only a minimal, low voltage current has to be provided to perform this continuity test. For example, in some circuits, such as those on chips formed with bipolar components, applications of 5 Volts or less, with less than 1 milli-amp current are all that is needed to forward bias the diodes 26 and provide the necessary measurable current flow. Moreover, voltages are supplied to each contact pad conductor 16 only once, so the circuit 12 components connected thereto are only exposed to a single current flow therethrough.

Another advantage of continuity test circuit 25 is that the continuity of a number of different lead sets 17 can be tested simultaneously. When a positive voltage is applied to the test contact pad 14a, current will flow through all of the diodes 26. Thus, a test apparatus can be provided to simultaneously detect the current flow at all the conductor terminals 22 electrically connected to the diodes 26. Consequently, only a minimal amount of time is required to perform continuity testing for all the leads 18 and 20.

Figure 1A:
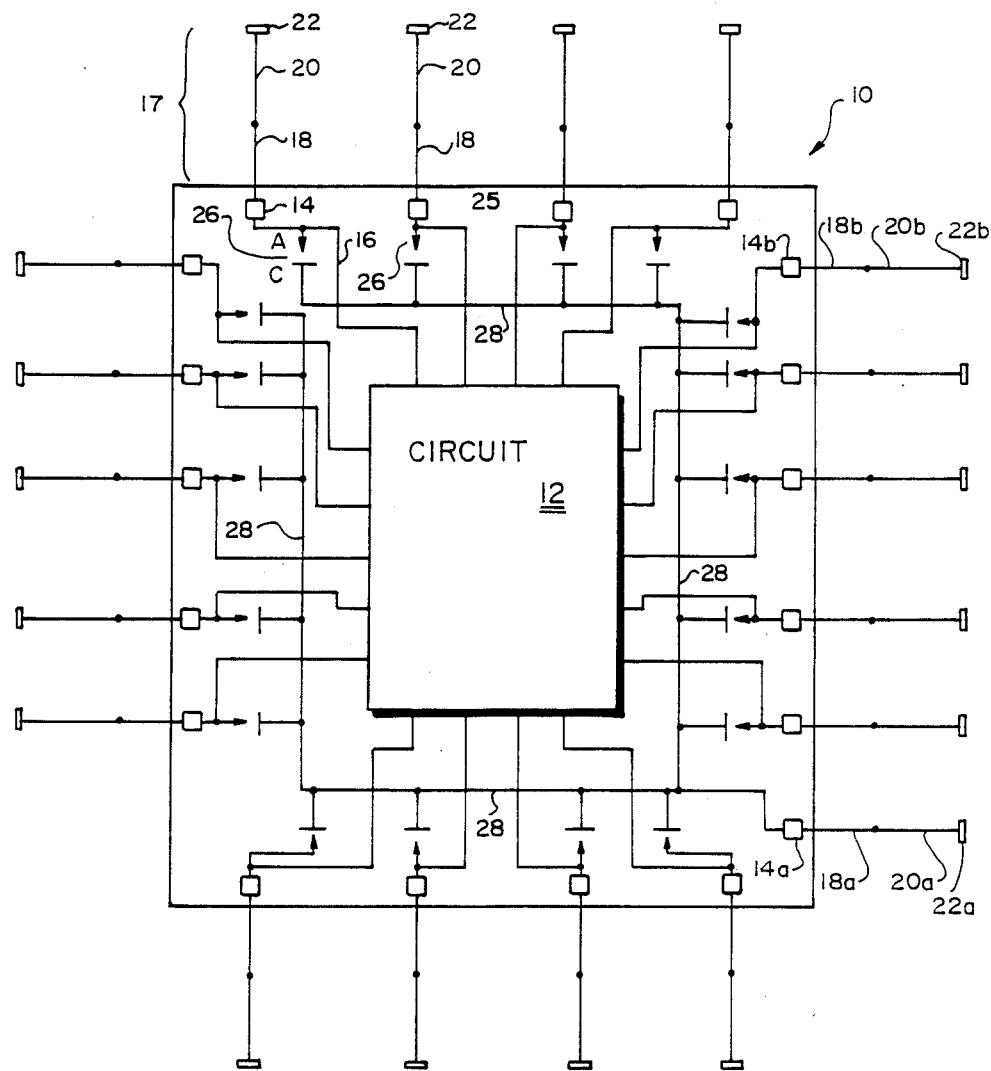
FIG. 1A is a circuit diagram of an alternate embodiment of the on-chip continuity test circuit constructed in accordance with the invention particularly directed to a chip containing bipolar components.

An alternate embodiment of the continuity test circuit is shown in FIG. 1A. This alternate embodiment operates like the embodiment shown in FIG. 1 except that the diodes in this alternate embodiment have their anode terminals connected to the contact pad conductor and their cathode terminals connected to the common conductor.

Figure 2:
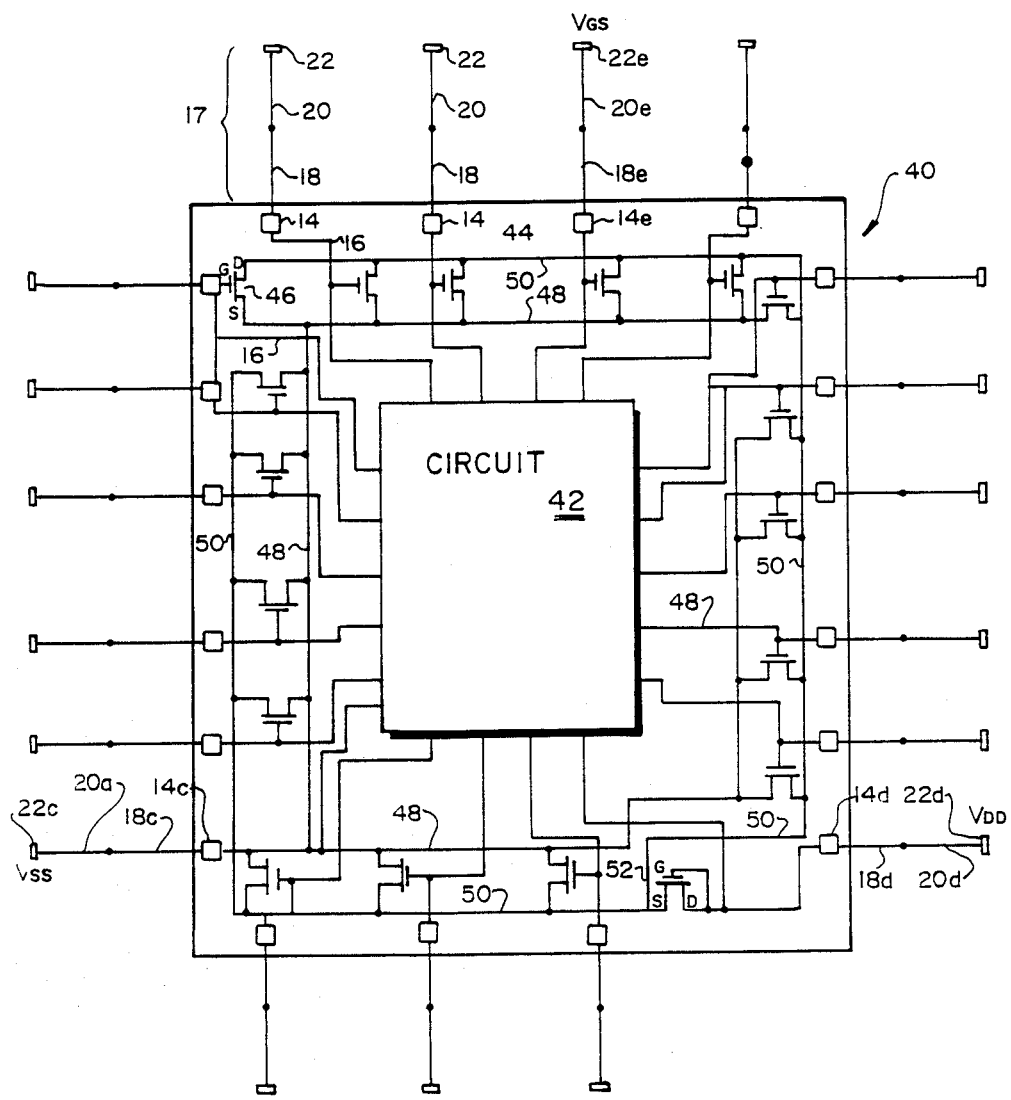
FIG. 2 is a circuit diagram of an embodiment of the on-chip continuity test circuit constructed in accordance with the invention particularly directed to a chip containing MOSFET components.

FIG. 2 depicts a chip 40 with a circuit 42 of MOSFET components. The chip 40 has a set of contact pads 14 connected to the circuit 42 components by contact pad conductors 16. Leads 18 and 20 provide an external conductive path between the contact pads 14 and the wiring board conductor terminals 22.

An on-chip continuity circuit 44 is provided to verify that the leads 18 and 20 are properly bonded. The on-chip continuity test circuit 44 includes a number of N-channel field effect transistors (FETs) 46, that function as current switching transistors. The gate terminal of each current switching transistor 46 is connected to a separate contact pad conductor 16 that extends between the circuit 42 and one of the contact pads 14. The source terminal of each transistor 46 is connected to a source voltage, that may be either internal or external to the chip 40. In the illustrated embodiment, the source terminal of all the transistors 46 are connected to a common source conductor 48. The source conductor 48 terminates at a source contact pad 14c that is connected by a set of leads 18c and 20c to conductor terminal 22a that is, in turn, connected to an off-chip source voltage, $V_{SS}$.

The drain terminals of the transistor 46 are connected to a common drain conductor 50 that is distinct from the substrate forming the chip 40. An N-channel field effect transistor 52, that functions as a current limiting transistor, has a source terminal connected to the drain conductor 50. The drain terminal of the current limiting transistor 52 is connected to a contact pad 14d that through a set of leads 18d and 20d is connected to a test pin output conductor terminal 22d. The gate terminal of the current limiting transistor 52 is tied to its drain to effectively form a resistive load.

The transistors 46 and 52 are sized so the current into the current limiting transistor 52 varies as a function of the voltages applied to the switching transistors 46. For instance, in one version of this embodiment of the invention, if 5.0 Volts are applied to the drain of the current limiting transistor 52 and 0.0 Volts to the switching transistors 46, the current into the current limiting transistor 52 will be 50 micro-Amps, and if 5.00 Volts is then applied to a single switching transistor 46, the current into the current limiting transistor will rise to 200 micro-Amps. This version of the invention may be assembled out of N-channel FETs.

The current switching transistors 46 act as current gates. When a voltage comprising a test signal is applied to the gate terminal of a current switching transistor 46, a rise in the current into the current limiting transistor 52 will serve as a measure of a complete circuit and lead continuity.

The bonding of leads 18e and 20e connected to the chip 40 is checked by continuity test circuit 44 by initially tri-stating the output drivers for the circuit 42 so they are in a high-impedance state, neither tied to pull-up or pull-down voltages. A drain voltage, $V_{DD}$, is then applied to the test pin conductor terminal 22d. A negative or ground voltage is applied to the source leads 18c and 20c to serve as the source voltage, $V_{SS}$.

The continuity of individual leads 18e and 20e bonded to the chip 40 is then tested by applying a small positive gate-to-source voltage, referred to as a gate voltage $V_{GS}$, to the conductor terminal 22e connected to the leads 18e and 20e being tested. The gates of the current switching transistors 46 associated with the leads 18 and 20 not being tested are simultaneously tied to ground. If the leads 18c, 18d, and 18e and leads 20c, 20d, and 20e are properly bonded, the gate terminal of the transistor 46 associated with the leads 18e and 20e being tested will be forward biased, and current will flow therethrough from the drain terminal to its source terminal. A measurable rise in current flow into the current limiting transistor 52 will serve as an indication leads 18c, 18d, and 18e and 20c, 20d, and 20e are properly bonded. If any of the leads 18c, 18d, 18e and 20c, 20d, and 20e are not properly bonded, the circuit will not be complete and it will be reflected in a low current flow into the current limiting transistor 52. After one set of leads 18e and 20e are tested, a voltage may be applied to another contact pad 22 to test another set of leads. During the subsequent lead tests, the drain voltage continues to be applied to the test pin conductor terminal 22d and the source voltage to the source voltage terminal 22c.

During normal operation of the chip 40, voltage applied to the test pin conductor terminal 22d, is blocked by the current switching transistors 46 from appearing on the on-chip conductors they are connected to. The test circuit 44 is also designed and spaced on the chip 40 so the current it does drawn during normal operation of the chip 40 does not adversely affect the normal signals to and from the chip 40. The continuity test circuit 44 is thus isolated from the components forming the chip circuit 42 when the chip 40 is in normal operation.

Morevoer, there is no need to dedicate specific contact pad-to-conductor terminal paths on the chip 40 as a test pin points since during normal operation of the chip 40, the current switching transistors 46 prevent voltages from test pin conductor terminal 22d from appearing on any other conductor terminal 22.

The continuity test circuit 44 allows the ready testing of leads 18 and 20 bonded to the chip 40 without the generating of a large set of test vectors and monitoring the response thereto. Low gate voltages, approximately in the range of 5 volts or less, with less than 1 micro-Amp of current, are typically sufficient to bias the current switching transistors 46 for drain to source current flow, are all that have to be applied to the terminal conductor 30 to test the lead bonding. Moreover, a voltage only has to be applied once to each terminal conductor 22 to test the leads 18 and 20 connected thereto.

Figure 3:
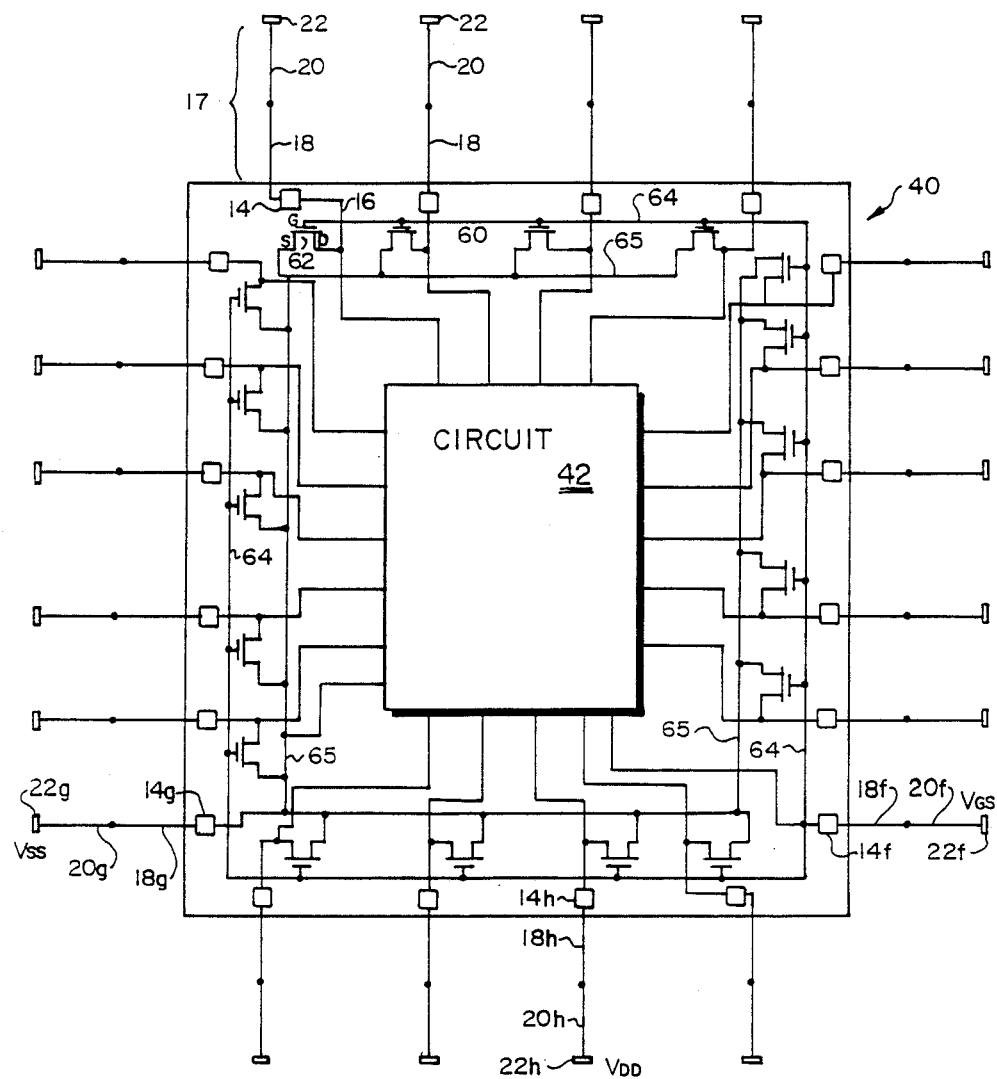
FIG. 3 is a circuit diagram of an alternative embodiment of the on-chip continuity test circuit constructed in accordance with the invention particularly directed to a chip containing MOSFET components.

An alternative on-chip continuity test circuit 60 for a chip 40 having MOSFET circuit components 42 is illustrated in FIG. 3. The continuity test circuit 60 includes a number of N-channel field effect transistors that function as current switching transistors 62. The drain terminals of the current switching transistors 62 are each connected to a separate contact pad conductor 16. The gate terminals of the transistors 62 are all connected to a common gate conductor 64 that is distinct from the substrate forming the chip. The gate conductor 64 terminates at a continuity contact pad 14f connected to a continuity conductor terminal 22f by a pair of leads 18f and 20f. The source terminals of the current switching transistors 62 are all connected to a common source conductor 65 distinct from the substrate forming the chip. The source conductor 65 is connected to an external source voltage, $V_{SS}$, through a souce contact pad 18g, leads 18g and 20g, and a source voltage conductor terminal 22g.

The current switching transistors 62 function as current gates. When a voltage is applied to the drain terminal of a specific current switching transistor 62 from the contact pad 22h connected thereto, there will only be measurable current flow when a forward biasing voltage is applied to the gate terminal of the current switching transistor 62 from the common gate conductor 64. In other words, the gate voltage serves as a test signal, and the resulting drain current is a response signal.

In one version of this embodiment of the invention the current switching transistors 62 are sized so that as each gate is forced to 5.0 Volts, current into the transistor will vary between 100 and 500 micro-Amps. This version of the invention may be assembled out of n-channel devices.

The continuity of a specific set of leads 18h and 20h bonded between a chip contact pad 14h and a conductor terminal 22h is verified with the continuity test circuit 62 by initially tri-stating the chip 40 so that all the output drivers that may cause a false indication of current flow through the test circuit 62 are deactivated. The source terminals of the current switching transistors 62 are tied to a source voltage $V_{SS}$, and a forward bias voltage, $V_{GS}$, is applied to their gate terminals over the gate conductor 64. A drain voltage, $V_{DD}$, is then applied to the conductor terminal 22h of the leads 18h and 20h to be tested. In some embodiments of the invention, the source voltage is tied to ground, the gate voltage is a positive logic level voltage, usually 5 Volts, so that for a given resistive load the drain current is in the order of 50 micro-Amps to 1 milli-amp, applied at 5 Volts. If leads 18f, 18g, 18h and 20f, 20g, and 20h are properly bonded, current will flow between the drain and source and will be detected thereby with an ammeter. If any of the leads 18f, 18g, and 18h and 20i f, 20g, and 20h are improperly bonded, no drain to source current flow will be detected.

When the continuity test circuit 60 is not in use, current flow into the current switching transistors 62 is blocked. Consequently, the current switching transistors 62 are isolated from the remainder of the circuit components 42 regardless of the currents that may appear on their drains. Furthermore, the current switching transistors block voltages from the continuity conductor terminal 22f from appearing on any other conductor terminal 22. Thus, this continuity test circuit 60 does not effect the operation of the chip 40.

The continuity test circuit 60 has the same advantages as the continuity test circuit 44. A further advantage of continuity test circuit 60 is that the drain voltages can be applied to all the conductor terminals at once to allow simultaneous testing of the lead sets 17 bonded thereto. A difference between the two test circuits 44 and 60 is that a high drain voltage must be supplied over the contact pad conductors 16 to cause current flow through the transistors 62 of test circuit 60. This is contrast to test circuit 44 wherein only a low current gate voltage, sufficient to forward bias the transistors 46, has to be applied over the contact pad conductors 16.

Figure 4:
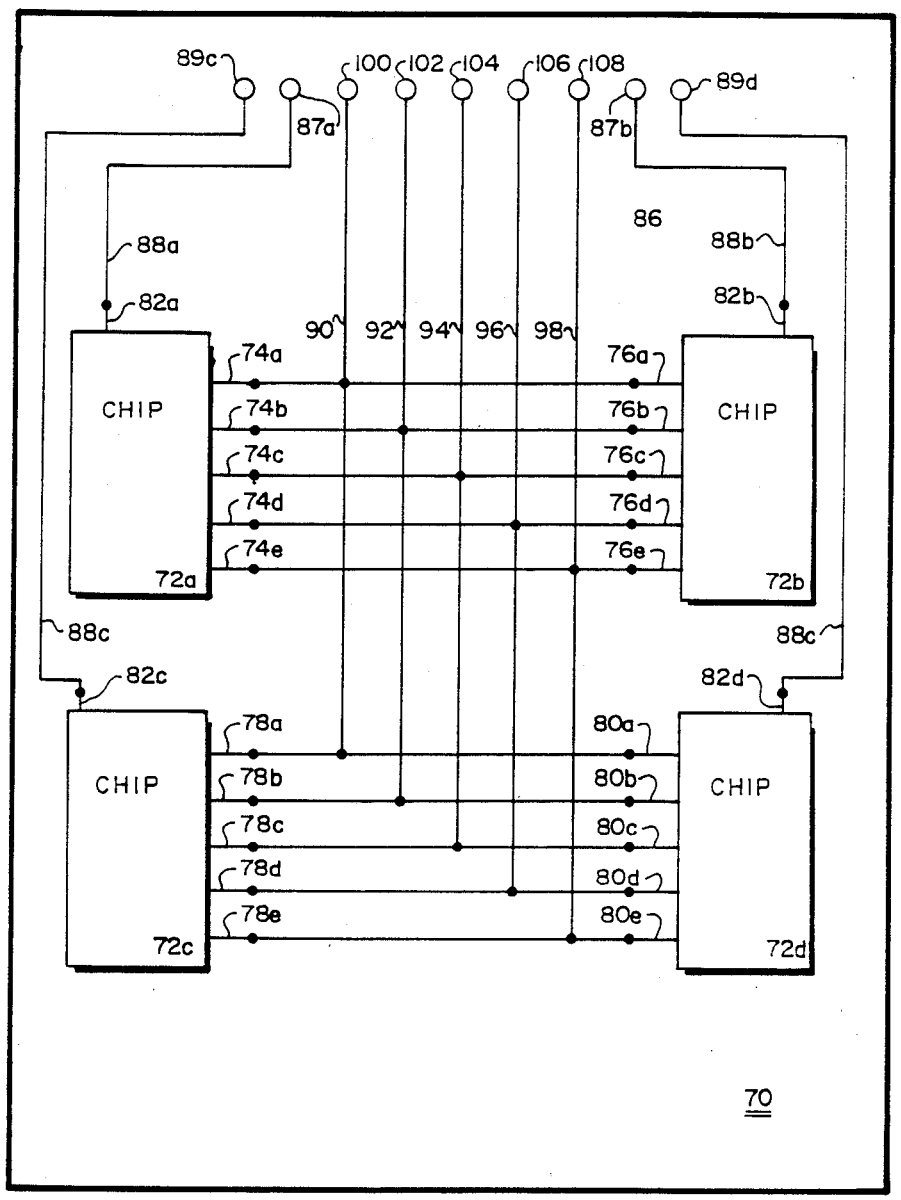
FIG. 4 is a block diagram of printed wiring board with a number of chips mounted thereon, each of the chips having an on-chip continuity test circuit, the printed wiring board having a continuity test circuit that enables the rapid continuity testing of all the leads bonded to the chips.

FIG. 4 is a block diagram of how a chip continuity test circuit can be employed on a module or printed wiring board 70 with a number of individual chips generally identified as 72. Each chip 72 has a set of leads 74a-3 to 80a-e respectively, which provides the connections to conductors on the wiring board. Integral with each chip 72 is a chip continuity test circuit appropriate for the components forming the chips. Usually, each chip 72 on a printed wiring board 70 has the same type of components and the same type of on-chip continuity test circuit. Each chip 72 has a test lead, 82a-d respectively, over which the appropriate common voltage or current for the on-chip continuity test circuit is supplied. For example, if the chips 72 each have a diode continuity test circuit 25 (FIG. 1), the test leads 82 are used for supplying a forward biasing voltage. If the chips 72 have continuity test circuit 44 with current switching transistors 46 and a current limiting transistor 52 (FIG. 2), the test leads 82 are used for supplying a drain current. If the chips 72 have a continuity test circuit 60 with current switching transistors 62 (FIG. 3), the test leads are used for supplying a gate voltage, $V_{GS}$. Not illustrated are source voltage leads which may be needed if the chips 72 are provided with some types of continuity test circuits, such as those with current switching transistors 46 or 62.

Each of the chip leads 74a-d through 82a-d are connected to a board continuity circuit 86 that allows the rapid testing of all the leads bonded to the printed wiring board 70. Each test lead 82a-d is connected to a specific board test conductor, 88a-d respectively. The test conductors 88a-d terminate at a specific board test point, 89a-d respectively. Each regular lead 74a-e through 80a-e is connected to a specific board conductor 90, 92, 94, 96, or 98, to which one or more other leads from the other chips 72a-d are also connected. In the illustrated embodiment, leads 74a, 76a, 78a and 80c are connected to conductor 90, leads 74b, 76b, 78b, and 80b are connected to conductor 92, leads 74c, 76c, 78c, and 80c are connected to conductor 94, leads 74d, 76d, 78d, and 80d are connected to conductor 96, and leads 74e, 76e, 78e and 80e are connected to conductor 98. Each of the board conductors 90, 92 94, 96, 98 and terminate at a specific test point 100, 102, 104, 106, and 108 respectively. In multi-layer printed wiring board leads 86a-d, 90, 92, 94, 96 and 98 may all be on a single layer of the board.

Continuity of all the leads 74a-d through 82a-d bonded to the chips 72a-d can be verified by the board continuity circuit 86 and the on-chip continuity circuits. The bonded leads can be tested sequentially, chip by chip, by intially applying the appropriate common voltage or current for that chip 72a, 72b, 72c, or 72d and to the appropriate test point 89a, 89b, 89c, or 89d, and then sequentially applying the appropriate current or voltge and monitoring the current produced to all the chip leads through the test points 100, 102, 104, 106 and 108. This would make it possible to automatically and rapidly verify the continuity of all the leads bonded to a specific chip with a minimal amount of effort. After the leads bonded to one chip have been tested, the leads bonded to a second chip may be tested by simply changing the test point 89a, 89b, 89c or 89d to which the common test current or voltage is applied.

Alternatively, continuity testing may be performed with the board continuity circuit 86 by sequentially testing all the leads 74a-e to 80a-e connected to individual conductors 90, 92, 94, 96 and 98. For example, with chips having the continuity circuit 44 composed only of current switching transistors 46 and a current limiting transistor (FIG. 2) with the gates of the current switching transistors 46 tied to the test points 100 through 108, an appropriate gate voltage would be applied first to conductor 90 through test point 100. Then a drain voltage would be sequentially applied over the test conductors 88a-d to the chips 72a-d. Thus, the continuity of leads 74a, 76a, 78a, and 80a would be sequentially tested. After the continuity of one set of leads is tested, a different conductor 92, 94, 96 or 98 is energized to test the leads 74b-80b, 74c-80c, 74d-80d, or 74e-80e connected thereto.

The foregoing description has been limited to specific embodiments of the invention. It will be apparent, however, that variations and modifications may be made to the invention with the attainment of some or all of the advantages of the invention. For example, in some embodiments of the on-chip continuity circuit comprising a set of diodes, it may be necessary to provide diodes with different orientations if positive and negative voltages normally are supplied and/or drawn from different contact pads when the chip is in operation. Depending on the particular design of a chip, it could be provided with a single circuit with diodes that are both forward biased and reversed biased so that positive and negative voltages are sequentially applied to the chip to verify lead continuity. Alternatively, the chip could be provided with two separate continuity test circuits, one with forward biased diodes connected to contact pad conductors 16 that positive voltage normally is applied to; and one with reverse biased diodes connected to contact pad conductors 16 negative voltage normally is applied to.

Other components besides diodes or current switching transistors and current limiting transistors may be used to form the continuity test circuit. Other constructions of the board continuity test circuit are also possible. For instance, in some embodiments of the invention, it may be desirable to fabricate the on-chip continuity test circuit with current switching transistors that are P-channel FETs. Moreover, a printed wiring board can be provided with two or more separate board continuity circuits. This would make it possible to test the lead bonds of two or more chips at the same time. Thus, it is the object of the appended claims to cover all such variations and modifications as common within the true spirit and scope of this invention.

What is claimed as new and desired to be secured by Letters Patent of the United States is:

1. A continuity test circuit for an integrated semi-conductor component comprising circuit components fabricated on a section of semi-conductor material, the semi-conductor component having a plurality of contact pads to which external conductive leads are bonded, and a like plurality of contact pad conductors, each extending between a separate contact pad and the individual circuit components, the continuity test circuit comprising:
   A. a common conductor fabricated on the integrated semi-conductor component, said common conductor connected to a test contact pad on the semi-conductor component to which external test leads are bonded thereto; and
   B. a plurality of current gate means fabricated on the integrated semi-conductor component each of said gate means having at least a first terminal and a second terminal, each first terminal of said gate current means connected to a separate contact pad conductor, each second terminal of said current gate means connected to said common conductor; each of said current gate means controlling current flow so that when a test signal is applied to only the associated first terminal or only the associated second terminal, a measurable response signal will appear at the terminal the test signal is not applied to.

2. The continuity test circuit of claim 1 wherein said gates are arranged so that the test signals are applied to said contact pad conductors and the response signal is measured at said test contact pad.

3. The continuity test circuit of claim 1 wherein said current gates are arranged so that the test signals are applied to each second terminal of said current gate means, over said common conductor from said test contact pad.

4. The continuity test circuit of claim 1 wherein said current gate means each comprise a separate diode means, each diode means having a cathode terminal and an anode terminal, each of said cathode terminals connected to the contact pad conductor associated therewith, each of said anode terminals connected to said common conductor.

5. The continuity test circuit of claim 1 wherein said current gate means each comprise a separate diode means, each diode means having a cathode terminal and an anode terminal, each of said anode terminals connected to the contact pad conductor associated therewith, each of said cathode terminals connected to said common conductor.

6. The continuity test circuit of claim 1 wherein said current gate means each comprise a separate current switching transistor, each said current switching transistor having a drain terminal, a source terminal, and a gate terminal, said drain terminals connected to said common conductor, said source terminals connected to a source voltage, and each of said gate terminals connected to a separate contact pad conductor.

7. The continuity test circuit of claim 6 further including a current limiting gate means connected to said common conductor between said contact pad and said current switching transistor drain terminals, said current limiting gate means blocking current flow on said common conductor in the absence of a signal on said test contact pad.

8. The continuity test circuit of claim 7 wherein said current limiting means comprises a current limiting transistor having a drain terminal connected to said test contact pad, a gate terminal connected to said drain terminal, and a source terminal connected to said common conductor.

9. The continuity test circuit of claim 1 wherein said current gate means comprises a plurality of separate current switching transistors, each of said current switching transistors having a drain terminal, a source terminal, and a gate terminal, said gate terminals connected to said common conductor, said source terminals connected to a source voltage and each of said drain terminals connected to a separate contact pad conductor.

10. The continuity test circuit of claim 1 further including each of said current gate means blocking any signals applied over the contact pad conductor associated therewith from appearing on said common conductor and any other contact pad conductor.

11. A method of testing the continuity of conductive leads bonded to an integrated semi-conductor component comprising a plurality of individual circuit components fabricated together on a section of semi-conductor material, the semi-conductor component having a plurality of contact pads to which conductive leads are bonded thereto, and contact pad conductors, each of the contact pad conductors extending between a separate contact pad and the individual circuit components, the continuity test including the steps of:
   A. providing a continuity test circuit on the semi-conductor component, the test circuit comprising a common conductor, said common conductor terminating at a test contact pad on the semi-conductor component, and a test lead set bonded to said test contact pad, a plurality of current gate means, each of said current gate means having a first terminal and a second terminal, each first terminal of said current gate means connected to a separate contact pad conductor, each second terminal of said current gate means connected to said common conductor, said current gate means generating a response signal at said first terminal only when a test signal is applied to said second terminal;
   B. applying a test signal to said test leads; and
   C. applying a monitoring means to selected lead set to detect if a response signal is generated from the current gate means associated therewith from the associated first terminal.

12. A method of testing the continuity of individual lead sets bonded to an integrated semi-conductor component comprising a plurality of individual circuit components fabricated together on a section of semi-conducting material, the semi-conductor component having a plurality of contact pads to which lead sets are individually bonded thereto, and contact pad conductors each of the contact pad conductors extending between a separate contact pad and the individual circuit components, the continuity test including the steps of:
   A. providing a continuity test circuit fabricated on the integrated semi-conductor component said continuity test circuit comprising a common conductor, said common conductor terminating at a test contact pad on the integrated semi-conductor component, a test lead set bonded to said test contact pad, and a plurality of current gate means, each of said current gate means having at least a first terminal and a second terminal, each first terminal of said current gate means connected to a separate contact pad conductor, each second terminal of said current gate means connected to said common conductor, said current gate means generating a response signal on the second terminal associated therewith only when a test signal is applied to the associated first terminal;

B. applying a first signal to each second terminal of said current gate means from said test leads;
C. applying a test signal to the lead set selected for continuity testing;
D. tying the lead sets not selected for testing to ground; and
E. monitoring said test leads to detect the response signal.

* * * * *